United States Patent
Kudoh et al.

(10) Patent No.: US 10,250,835 B2
(45) Date of Patent: Apr. 2, 2019

(54) IMAGING DEVICE INCLUDING PIXEL REGION HAVING ISOLATED REGION AND SHADED REGION AND IMAGING SYSTEM INCLUDING IMAGING DEVICE

(71) Applicants: Yuusuke Kudoh, Osaka (JP); Tohru Kanno, Osaka (JP)

(72) Inventors: Yuusuke Kudoh, Osaka (JP); Tohru Kanno, Osaka (JP)

(73) Assignee: RICOH COMPANY, LTD., Tokyo (JP)

( * ) Notice: Subject to any disclaimer, the term of this patent is extended or adjusted under 35 U.S.C. 154(b) by 41 days.

(21) Appl. No.: 15/434,271

(22) Filed: Feb. 16, 2017

(65) Prior Publication Data

US 2017/0251156 A1    Aug. 31, 2017

(30) Foreign Application Priority Data

Feb. 26, 2016 (JP) ................. 2016-035556
Nov. 30, 2016 (JP) ................. 2016-233562

(51) Int. Cl.
| | |
|---|---|
| H04N 5/335 | (2011.01) |
| H04N 5/378 | (2011.01) |
| H04N 9/04 | (2006.01) |
| H04N 5/359 | (2011.01) |
| H01L 27/146 | (2006.01) |

(52) U.S. Cl.
CPC ......... *H04N 5/378* (2013.01); *H01L 27/1463* (2013.01); *H01L 27/14621* (2013.01); *H01L 27/14636* (2013.01); *H04N 5/359* (2013.01); *H04N 9/045* (2013.01)

(58) Field of Classification Search
CPC ....................................... H04N 5/359
See application file for complete search history.

(56) References Cited

U.S. PATENT DOCUMENTS

| | | | |
|---|---|---|---|
| 2011/0069210 A1* | 3/2011 | Ogura .................... | H04N 5/359 348/247 |
| 2016/0005782 A1* | 1/2016 | Aoki ..................... | H01L 23/552 257/435 |
| 2016/0013226 A1* | 1/2016 | Shim .................. | H01L 27/14612 348/273 |
| 2017/0171483 A1 | 6/2017 | Kudoh et al. | |

FOREIGN PATENT DOCUMENTS

| | | |
|---|---|---|
| JP | 2011-066801 | 3/2011 |
| JP | 5460202 | 1/2014 |
| JP | 2015-106908 | 6/2015 |
| JP | 2017-038157 | 2/2017 |
| JP | 2017-112605 | 6/2017 |

* cited by examiner

*Primary Examiner* — Gary C Vieaux
(74) *Attorney, Agent, or Firm* — Cooper & Dunham LLP

(57) ABSTRACT

An imaging device includes a pixel region in which a plurality of pixels and a plurality of charge-to-voltage conversion circuits are arranged in matrix. The pixels include photoelectric conversion elements that output charges in accordance with intensity of received light. The charge-to-voltage conversion circuits convert the charges output from the pixels into voltage signals. The pixel region includes an isolated region including isolated shaded pixels covered with a first shading metal of the same layer as a layer of wiring metals of the charge-to-voltage conversion circuits, and an isolated pixel that is not covered with the metal. All the pixels surrounding the isolated pixel in the isolated region are the isolated shaded pixels.

9 Claims, 10 Drawing Sheets

IMAGING DEVICE INCLUDING PIXEL REGION HAVING ISOLATED REGION AND SHADED REGION AND IMAGING SYSTEM INCLUDING IMAGING DEVICE

CROSS-REFERENCE TO RELATED APPLICATIONS

The present application claims priority under 35 U.S.C. § 119 to Japanese Patent Application No. 2016-035556, filed on Feb. 26, 2016 and Japanese Patent Application No. 2016-233562, filed on Nov. 30, 2016. The contents of which are incorporated herein by reference in their entirety.

BACKGROUND OF THE INVENTION

1. Field of the Invention

The present invention relates to an imaging device and an imaging system.

2. Description of the Related Art

An image sensor, or an imaging device, includes a plurality of pixels including photoelectric conversion elements that receive light and convert the light into charges in accordance with the intensity of the received light. The pixels receive light directly entering the pixels and light leaking from adjacent pixels. Thus, the pixels are affected by such light leakage from the adjacent pixels. The light leakage has a more significant influence on smaller pixels. Thus, image sensors with far smaller pixels that are available these days cannot ignore the influence of the light leakage.

Japanese Unexamined Patent Application Publication No. 2011-066801 discloses an imaging system that can measure the quantity of light leakage between pixels in an image sensor. The image sensor disclosed in Japanese Unexamined Patent Application Publication No. 2011-066801 has a shaded pixel region. The shaded pixel region includes shaded pixels that are covered with metal and are optically shielded and open pixels that are not optically shielded and interspersed in the shaded pixels. In the imaging system disclosed in Japanese Unexamined Patent Application Publication No. 2011-066801, light leaking from an open pixel to a shaded pixel is measured as light leakage. By using the measured light leakage, the imaging system corrects light leakage (color mixing) from a pixel in a region that images a subject to a pixel of interest adjacent to the pixel.

When such an open pixel is formed by forming an aperture in the shading metal that covers the pixels, light entering from the aperture to the open pixel behaves differently from light that enters a region for imaging a subject due to some reasons such as differences in disposition of the metal. Thus, the imaging system described above has a problem in that the measured light leakage differs from the light leakage that actually occurs.

SUMMARY OF THE INVENTION

According to one aspect of the present invention, an imaging device includes a pixel region in which a plurality of pixels and a plurality of charge-to-voltage conversion circuits are arranged in matrix. The pixels include photoelectric conversion elements that output charges in accordance with intensity of received light. The charge-to-voltage conversion circuits convert the charges output from the pixels into voltage signals. The pixel region includes an isolated region including isolated shaded pixels covered with a first shading metal of the same layer as a layer of wiring metals of the charge-to-voltage conversion circuits, and an isolated pixel that is not covered with the metal. All the pixels surrounding the isolated pixel in the isolated region are the isolated shaded pixels.

BRIEF DESCRIPTION OF THE DRAWINGS

The accompanying drawings are intended to depict exemplary embodiments of the present invention and should not be interpreted to limit the scope thereof. Identical or similar reference numerals designate identical or similar components throughout the various drawings.

DESCRIPTION OF THE EMBODIMENT

Figure 1:
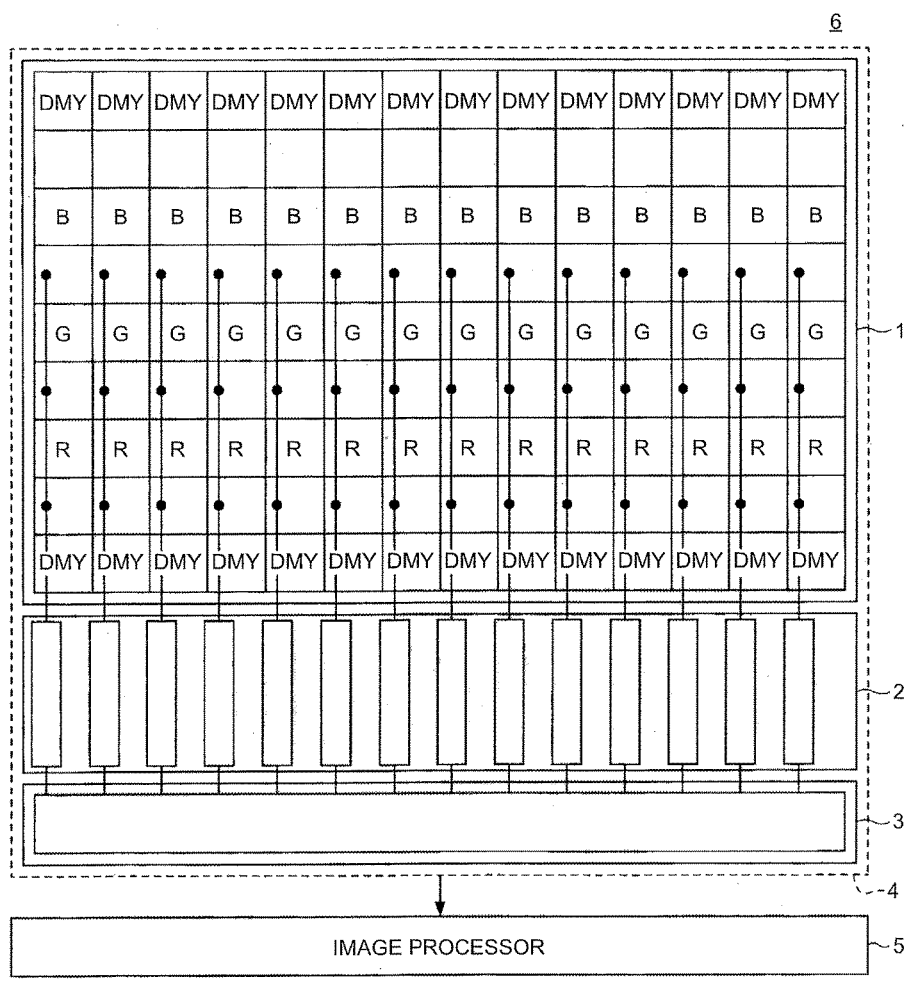
FIG. 1 is a diagram illustrating a schematic configuration of an image sensor.

The terminology used herein is for the purpose of describing particular embodiments only and is not intended to be limiting of the present invention.

As used herein, the singular forms "a", "an" and "the" are intended to include the plural forms as well, unless the context clearly indicates otherwise.

In describing preferred embodiments illustrated in the drawings, specific terminology may be employed for the sake of clarity. However, the disclosure of this patent specification is not intended to be limited to the specific terminology so selected, and it is to be understood that each specific element includes all technical equivalents that have the same function, operate in a similar manner, and achieve a similar result.

An object of an embodiment is to measure a quantity of light leakage closer to the quantity of light leakage that actually occurs in a region for imaging a subject.

An embodiment of the present invention will be described in detail below with reference to the drawings.

An imaging device according to the present invention includes an isolated region where light leakage is measured. The isolated region includes isolated shaded pixels that are covered with a metal positioned in the same layer as a layer of wiring metals of charge-to-voltage conversion circuits, and includes an isolated pixel that is not covered with the metal. The metal that covers the isolated shaded pixels is positioned at the same level (the same height level relative to the pixels) as the metals (i.e., the wiring metals) disposed above the effective pixels that image a subject. Thus, the imaging device can measure a quantity of light leakage closer to the quantity of light leakage that actually occurs in the effective pixel.

An embodiment of the present invention will now be described in detail with reference to the accompanying drawings. The constituent elements, types, combinations, forms, and relative dispositions described in the embodiment are not intended to limit the scope of the present invention and are presented only for illustrative purposes only unless otherwise specified.

In the following description, supplementary characters "_b", "_g", "_r", and "_dmy" added to reference signs represent blue (B), green (G), red (R), and dummy (DMY), respectively. When elements are described without referring to colors, the supplementary characters are not added to the reference signs. The combination of colors described in the following is presented for illustrative purposes only, and the colors and the number of colors in the combination are not limited to this.

In the following description, a phrase "a pixel is adjacent to another pixel (pixels are adjacent to each other)", or a phrase "a pixel is next to another pixel (pixels are next to each other)" represents a state only in terms of the pixels. Thus, the presence of charge-to-voltage conversion circuits between pixels is ignored in this phrase.

Schematic Configuration of Image Sensor

FIG. 1 is a diagram illustrating a schematic configuration of an image sensor.

The image sensor (imaging device) 4 includes a pixel region 1, a vertical signal processor 2, and a horizontal signal processor 3. The image sensor 4 is installed in, for example, facsimiles, copiers, scanners, video cameras, and digital cameras, and used for obtaining image data of a subject to be imaged or a medium to be scanned.

Figure 2:
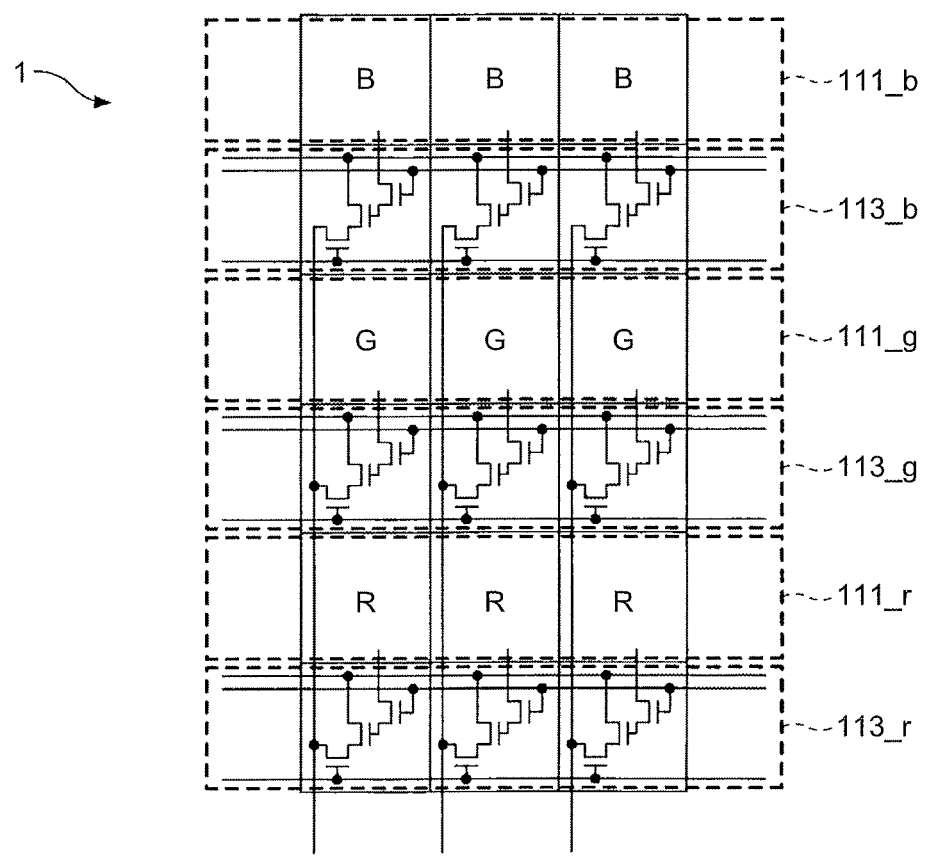
FIG. 2 is a diagram illustrating an example of a pixel region.

FIG. 2 is a diagram illustrating an example of the pixel region. FIG. 2 illustrates an effective region 11 (see FIG. 3) in the pixel region 1. Other regions (an isolated region 12 and a shaded region 13) have the same configuration as the effective region 11.

The pixel region 1 has a configuration in which a plurality of pixels, which are effective pixels 111 (111_b, 111_g, and 111_r), and charge-to-voltage conversion circuits 113 (113_b, 113_g, and 113_r) are alternately aligned in the column direction and are arranged in matrix. The effective pixels include photo diodes (photoelectric conversion elements) that output charges in accordance with the intensity of received light. The charge-to-voltage conversion circuits 113 convert the charges output from the pixels into voltage signals. The pixels 111_b, 111_g, and 111_r are collectively referred to as the pixels 111, and the charge-to-voltage conversion circuits 113_b, 113_g, and 113_r are collectively referred to as the charge-to-voltage conversion circuits 113 unless otherwise distinguished.

The pixel region 1 illustrated in FIG. 2 includes three types of pixels that are blue (B), green (G), and red (R) pixels, and their corresponding charge-to-voltage conversion circuits. In other words, a pixel 111_b is a blue pixel, a pixel 111_g is a green pixel, and a pixel 111_r is a red pixel. A charge-to-voltage conversion circuit 113_b receives a signal from an adjacent blue pixel 111_b and converts a charge into a voltage signal. A charge-to-voltage conversion circuit 113_g receives a signal from an adjacent green pixel 111_g and converts a charge into a voltage signal. A charge-to-voltage conversion circuit 113_r receives a signal from an adjacent red pixel 111_r and converts a charge into a voltage signal.

Any desired type of color variations may be set in the pixel region 1. Any desired number of pixels for each color may be set in the pixel region 1. The arrangement of colors and the disposition of the charge-to-voltage conversion circuits illustrated in FIG. 2 are presented for illustrative purposes only. Pixels with the reference sign DMY are dummy pixels. Each pixel 111 outputs a charge in accordance with the intensity of received light having a color component corresponding to the pixel, and thus, the pixel 111 is provided with a color filter that only allows the color component corresponding to the pixel 111 to pass through. The method of disposing color filters will be described later.

The charge-to-voltage conversion circuits 113 convert charges into voltage signals, and the voltage signals are sequentially read by the vertical signal processor 2 illustrated in FIG. 1. Although, in FIGS. 1 and 2, the pixels 111_b, 111_g, and 111_r aligned in the column direction use a common readout line, the pixels may use their own dedicated readout lines that are provided for the respective pixels.

Referring back to FIG. 1, the vertical signal processor 2 performs gain adjustment and offset adjustment on the voltage signals output from the charge-to-voltage conversion circuits 113, and performs analog-to-digital conversion to output signals (digital signals).

The horizontal signal processor 3 performs, for example, sorting of the digital signals output from the vertical signal processor 2, and outputs the signals as data.

An image processor 5 that processes the digital signals output from the horizontal signal processor 3 is provided at the subsequent stage of the image sensor 4. An imaging system 6 is configured by combining at least the image processor 5 and the image sensor 4.

The image processor 5 performs, for example, dark correction to be described later, and various types of calculation such as light leakage calculation. The image processor 5 is configured by a computer including, for example, a central processing unit (CPU), a read only memory (ROM), and a random access memory (RAM). The CPU reads a computer program stored in the ROM and loads it on the RAM and executes the computer program. With this configuration, the image processor 5 performs various types of calculation.

In the imaging system 6, the image sensor 4 images a subject and performs photoelectric conversion to output data. The image processor 5 then reads the data and performs calculation on the data. The imaging system 6 is used for, for example, obtaining image data of a subject to be imaged or a medium to be read. The imaging system 6 functions as an image information reading unit (detection unit) included in a facsimile, a copier, or a scanner, or a reading unit included in a video camera or a digital camera.

Regions and Arrangement of Regions in Pixel Region

Figure 3:
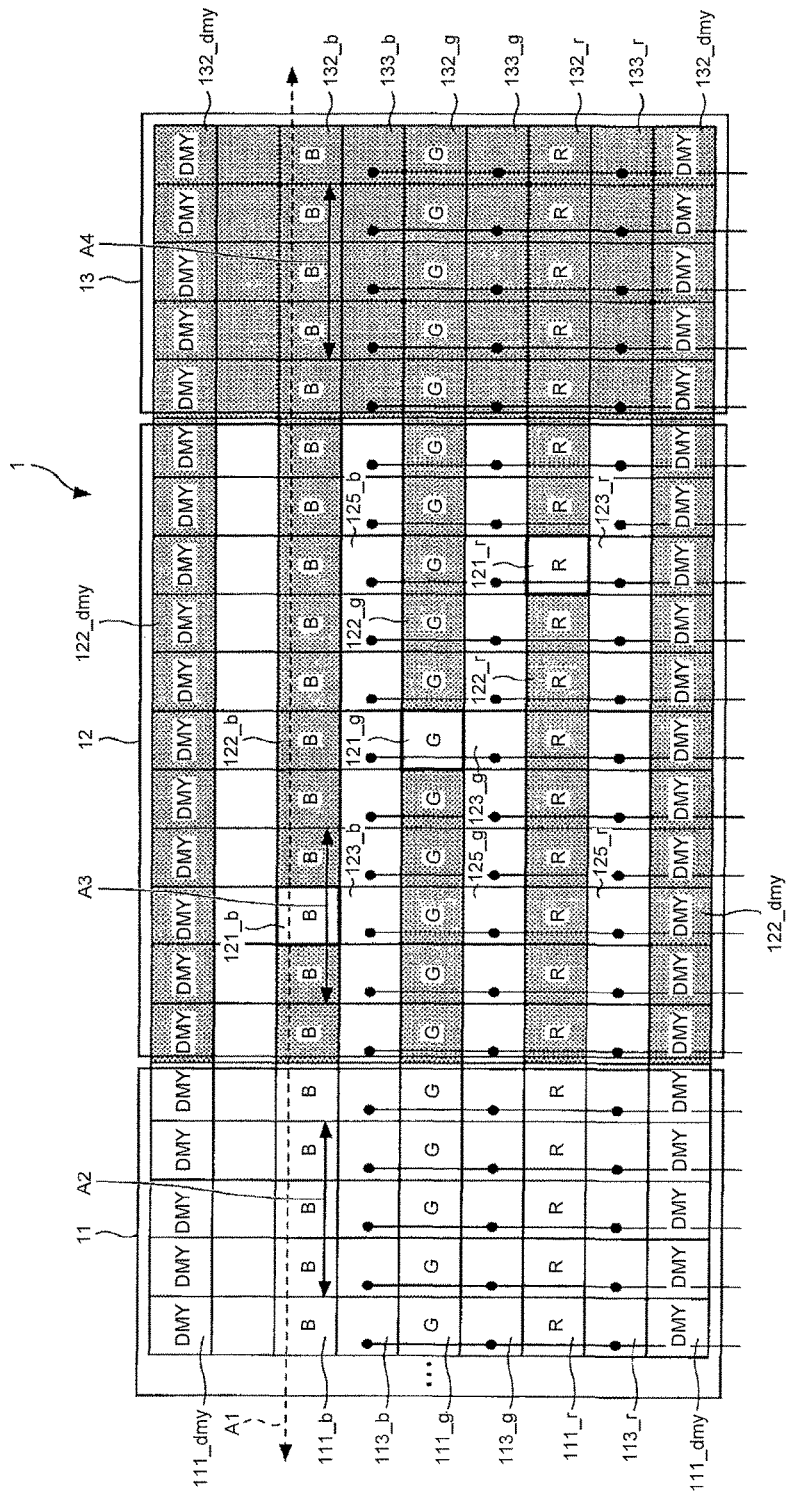
FIG. 3 is a diagram illustrating a configuration of an effective region, an isolated region, and a shaded region.
Figure 4:
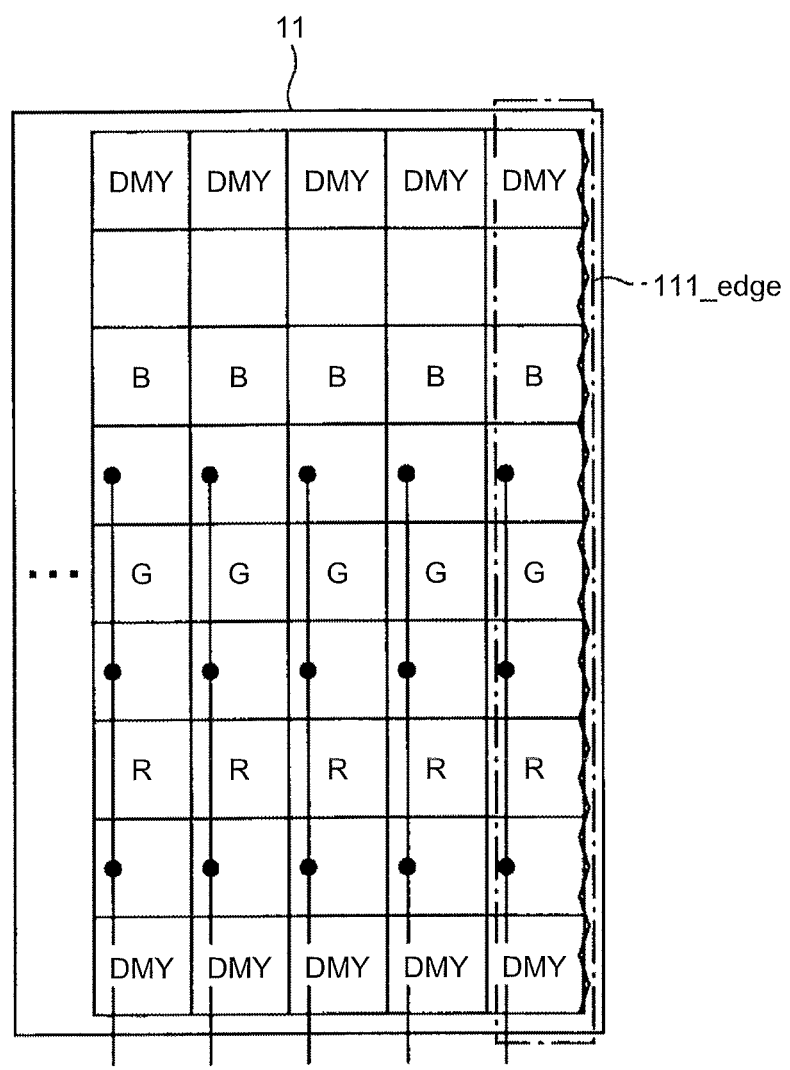
FIG. 4 is a diagram illustrating a characteristic of pixels located at an end of the effective region.

FIG. 3 is a diagram illustrating a configuration of the effective region, the isolated region, and the shaded region. FIG. 4 is a diagram illustrating a characteristic of pixels located at an end of the effective region.

The pixel region 1 includes the effective region 11, the isolated region 12, and the shaded region 13.

The effective region 11 is used for imaging a subject. The effective region 11 includes a plurality of effective pixels 111 that image a subject. All the pixels in the effective region 11 receive light. The pixels included in the effective region 11 are referred to as effective pixels 111. Brightness signals obtained in the effective region 11 are processed as signals representing image data generated by imaging a subject. Although FIG. 4 only illustrates five columns of pixels to simplify the description, the effective region 11 actually includes several thousands to several hundreds of thousand pixels.

The isolated region 12 is interposed between the effective region 11 and the shaded region 13 to measure light leakage. Details thereof are described later.

Pixels (shaded pixels 132) in the shaded region 13 receive no light. Pixels included in the shaded region 13 are referred to as shaded pixels 132. From the shaded pixels 132, black-level data can be acquired via the charge-to-voltage conversion circuits 133. The black-level data acquired from the shaded pixels 132 is used for dark correction. Dark correction is a type of image processing for correcting an image by subtracting a value of black-level data acquired from the shaded pixels 132 from a value of data acquired from the effective pixels 111. In the shaded region 13, the shaded pixels 132 and the charge-to-voltage conversion circuits 133 are entirely covered with a metal and are optically shielded. The metal (shading metal, second shading metal) for optically shielding the shaded region 13 is disposed in an upper layer than wiring layers.

The following describes details of the isolated region 12. The isolated region 12 includes isolated pixels 121 (121_b, 121_g, 121_r) that are not covered with a metal and isolated shaded pixels 122 (122_b, 122_g, 122_r, 122_dmy) that are covered with a metal (shading metal, first shading metal). Pixels adjacent to an isolated pixel 121 are isolated shaded pixels 122. In other words, all the pixels adjacent to the isolated pixel 121, or all the pixels surrounding the isolated pixel 121 are isolated shaded pixels 122.

Pixel portions alone are covered by the metal, and other portions (e.g., charge-to-voltage conversion circuits 123_b, 123_g, 123_r) are not covered with the metal. Used as a metal covering the isolated shaded pixels 122 may be, therefore, a metal of the same layer as the layer of the wiring metal of the charge-to-voltage conversion circuits 123 or a metal of an upper layer than the layer of the wiring metals of the charge-to-voltage conversion circuits 123. The wiring metals of the charge-to-voltage circuits 123 are arranged in the same manner as the wiring metals of the charge-to-voltage circuits in the effective region 11.

In the isolated region 12, light leakage is measured from the relation between data values obtained from the isolated pixels 121_b, 121_g, and 121_r and data values obtained from the isolated shaded pixels 122 located around the isolated pixels. The method of measuring light leakage will be described later.

The isolated region 12 includes at least one isolated pixel 121_b corresponding to blue, at least one isolated pixel 121_g corresponding to green, and at least one isolated pixel 121_r corresponding to red. With this configuration, light leakage for each color can be measured.

Suppose that an isolated shaded pixel 122 is adjacent to a plurality of isolated pixels 121, specifically, for example, that an isolated shaded pixel 122 belongs to pixels that surround an isolated pixel 121_b and also belongs to pixels that surround an isolated pixel 121_g. The isolated shaded pixel 122 detects light including light leakage from the isolated pixel 121_b and light leakage from the isolated pixel 121_g, which makes it difficult to measure an accurate quantity of light leakage from each isolated pixel. In the present embodiment, the isolated pixels 121_b, 121_g, and 121_r are disposed away from each other by two or more columns of pixels interposed therebetween. In other words, two or more columns of isolated shaded pixels 122 are interposed between an isolated pixel 121 and a next isolated pixel 121 located in the column direction. This configuration is applicable to an isolated pixel and a next isolated pixel located in the row direction. The isolated pixels are disposed away from each other to prevent an isolated shaded pixel from receiving light leaking from two or more isolated pixels.

The positional relation of the regions is described below.

Supposing that the effective region 11 and the shaded region 13 are arranged adjacent to each other, pixels in a boundary region between the effective region 11 and the shaded region 13 are affected by each other, thereby affecting the characteristic of the pixels. If the shaded region 13 is arranged adjacent to the effective region 11, a charge accumulated by photoelectric conversion of the received light is horizontally transmitted to the shaded region 13, or light traveling toward the effective region 11 is reflected and re-reflected on the metal to enter the shaded region 13, for example. This makes it difficult to achieve effective shading.

Thus, the effective pixels 111 provided for acquiring image data need to be arranged away from the shaded pixels 132. In the present embodiment, the isolated region 12, which is not used for acquiring image data, is interposed between the effective region 11 and the shaded region 13, and is effectively used as a buffer (buffer region). Such arrangement can prevent pixels in the effective region 11 and pixels in the shaded region 13 from affecting each other.

As discussed above, not arranging the effective region 11 adjacent to the shaded region 13 can prevent the effective pixels 111 from being affected by the shaded pixels 132. Supposing that, however, no pixels are arranged adjacent to the effective region 11 as illustrated in FIG. 4, the absence of pixels affects the characteristics of effective pixels 111_edge located close to an edge of the effective region 11. Thus, at least isolated shaded pixels 122 or dummy pixels are disposed adjacent to the effective region 11.

Although, in FIG. 3, the shaded region 13 is arranged adjacent to the isolated region 12, the shaded region 13 may not be arranged adjacent to the isolated region 12. In this case, a dummy region including dummy pixels may be arranged instead of the shaded region 13. The entire or a part of the dummy region may be covered with metal, and the entire dummy region is not necessarily covered with the metal. When a part of the dummy region is covered with metal, for example, the dummy region can be configured such that only dummy pixels are shaded by the metal and the charge-to-voltage conversion circuits are not.

Light leakage includes two types of light leakage one of which is leakage of light coming from above that leaks because the light is hard to diffract and is easy to pass through, and the other one of which is leakage of charges, which are generated by photoelectric conversion of light, leaking in the horizontal direction. In both cases, light having a shorter wavelength causes less light leakage. To prevent a charge from horizontally leaking to the effective region 11, the isolated pixel 121_b, which receives light having the shortest wavelength out of the isolated pixels 121 (121_b, 121_g, 121_r), is arranged closest to the effective region 11 located in the left in FIG. 3. In contract, the isolated pixel 121_r, which receives light having the longest wavelength, is arranged most away from the effective region 11. This configuration can minimize the influence of light leakage from the isolated pixels 121 to the effective pixels 111. When, for example, the pixel region includes red, green, and blue pixels, the isolated pixel 121_b corresponding to blue having the shortest wavelength is arranged close to the effective region 11, and the isolated pixel 121_r corresponding to red having the longest wavelength is arranged away from the effective region 11.

First charge-to-voltage conversion circuits 123_b, 123_g, and 123_r are disposed close to the isolated pixels 121_b, 121_g, and 121_r that receive light having the respective colors. The first charge-to-voltage conversion circuits 123b, 123g, and 123r convert light received by the isolated pixels 121b, 121g, and 121r into charges.

Disposed around the charge-to-voltage conversion circuits 123b, 123g, and 123r are second charge-to-voltage conversion circuits 125b, 125g, and 125r each corresponding to an isolated shaded pixel 122. The second charge-to-voltage conversion circuits detect light leakage from the corresponding isolated shaded pixels and photoelectrically converts the light into charges.

Cross Section of Pixels

Figure 5:
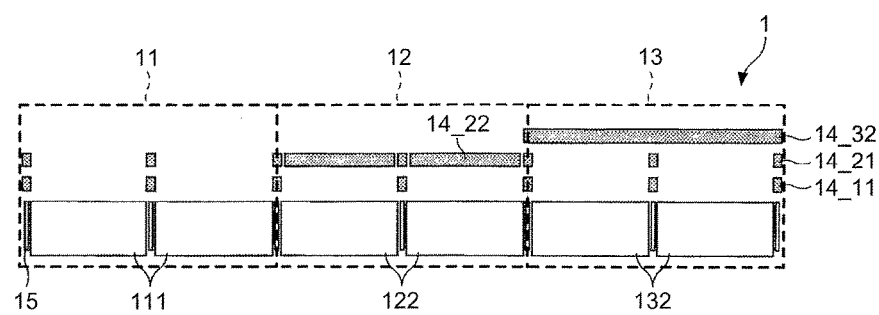
FIG. 5 is a schematic cross-sectional view of pixels in the effective region, the isolated region, and the shaded region.

FIG. 5 is a schematic cross-sectional view of pixels in the effective region, the isolated region, and the shaded region. FIG. 5 representatively illustrates effective pixels 111, isolated shaded pixels 122, and shaded pixels 132. Although FIG. 5 illustrates a cross section of a portion corresponding to the double-pointed arrow A1 in FIG. 3, pixels illustrated in FIG. 5 are limited to two pixels each for the regions.

The pixel region 1 includes, as the metal for wiring, wiring metals 14_11 disposed in the lowest layer (first layer) closest to the pixels, and wiring metals 14_21 disposed in a middle layer (second layer) located above the wiring metals 14_11. The pixel region 1 includes, as the metal for shading the pixels, a shading metal 14_22 disposed in the middle layer (second layer) located above the wiring metals 14_11 and a shading metal 14_32 disposed in the uppermost layer (third layer).

The wiring metals 14_11 and 14_21 are metals for the wirings of the charge-to-voltage conversion circuits. Adjacent pixels (pixels with no charge-to-voltage conversion circuit interposed therebetween) are separated by a pixel separation region 15, and the wiring metals 14_11 and 14_21 are disposed above the pixel separation region 15.

The effective region 11 and the isolated region 12 include the metal in the lowest layer (wiring metals 14_11) and the metal in the middle layer (the wiring metals 14_21 or the shading metal 14_22), and thus, the height level of the metal layers in these two regions are the same. The shading metal 14_32 that covers the pixels in the shaded region 13 is arranged in an upper layer than the layer of the wiring metals 14_11 and 14_21, and thus, the height level of the metal layers in the shaded region 13 is higher than that of the effective region 11 and the isolated region 12.

Incident Light

Figure 6:
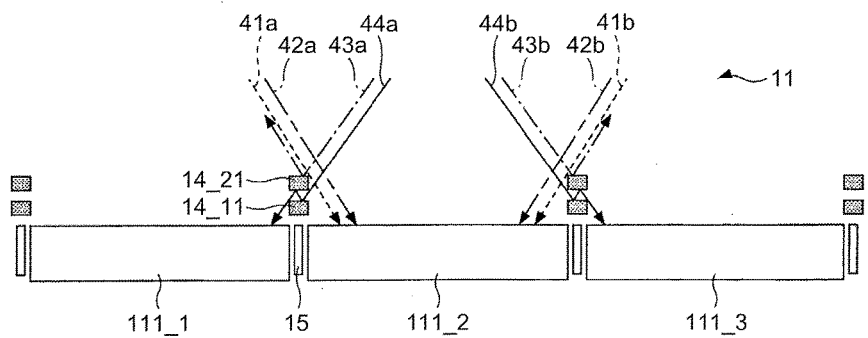
FIG. 6 is a schematic cross-sectional view illustrating the behavior of incident light rays in the effective region.
Figure 7:
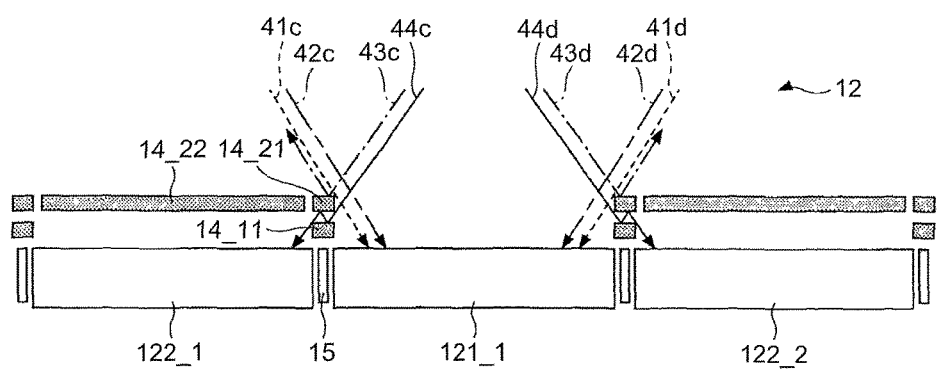
FIG. 7 is a schematic cross-sectional view illustrating the behavior of incident light rays in the isolated region.
Figure 8:
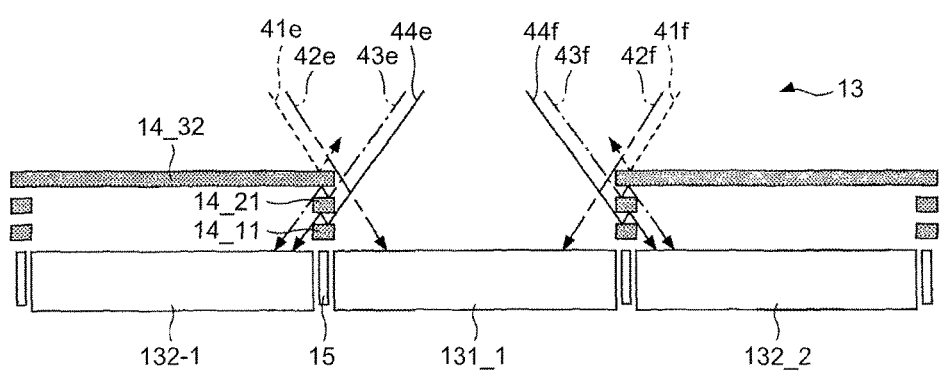
FIG. 8 is a schematic cross-sectional view illustrating the behavior of incident light rays if an open pixel is provided in the shaded region.

Described next is the behavior of incident light rays in the regions. FIG. 6 is a schematic cross-sectional view illustrating the behavior of incident light rays in the effective region. FIG. 7 is a schematic cross-sectional view illustrating the behavior of incident light rays in the isolated region. FIG. 8 is a schematic cross-sectional view illustrating the behavior of incident light rays if an open pixel is provided in the shaded region.

FIGS. 6 to 8 illustrate the behavior of incident light rays 41 (41a to 41f), 42 (42a to 42f), 43 (43a to 43f), and 44 (44a to 44f) entering an area around the boundary between pixels (around the pixel separation region 15). The incident light rays discussed herein do not vertically enter the pixels. In the present embodiment, these light rays are the target of measurement regarding the light leakage. Supposing that no metal is provided on the pixels, the incident light rays 41 to 44 illustrated in FIGS. 6 to 8 are supposed to enter the pixels at the same incident angle on the same positions.

FIG. 6 illustrates a cross section of a portion of the effective region 11 corresponding to the double-pointed arrow A2 in FIG. 3, for example. In the effective region 11 illustrated in FIG. 6, the effective pixels 111 (111_1 to 111_3) are open upward. The wiring metals 1411 and 14_21 in the effective region 11 are disposed above the pixel separation region 15.

The wiring metals 14_11 and 14_21 disposed in the effective region 11 illustrated in FIG. 6 prevent the light rays approaching the effective pixels 111_1 to 111_3 from above from entering other pixels therearound.

The behavior of light is described by using a plurality of incident light rays 41a to 44f with reference to FIGS. 6 to 8. In FIG. 6, for example, the incident light rays 41a, 41b, 42a, and 42b represent rays of light approaching the effective region 11 from outside to inside direction of the effective region 11 at a certain angle, and the incident light rays 43a, 43b, 44a, and 44b represent rays of light approaching the effective region 11 from immediately above to outside of the effective region 11. All the incident light rays 41a to 44b approaching the effective region 11 are at an equal incident angle.

Of the incident light rays 41a, 41b, 42a, 42b, 43a, 43b, 44a, and 44b approaching the effective region 11 at the incident angle illustrated in FIG. 6, the incident light rays 41a, 41b, 42a, and 42b are not reflected by the wiring metals 14_11, and travel straight and directly enter the effective pixel 111_2.

The incident light rays 43a and 43b are reflected on the wiring metals 14_21 and thus are prevented from entering any one of the effective pixels 111_1 to 111_3.

The incident light ray 44a is reflected on the wiring metal 14_11 on the left in FIG. 6 and re-reflected on the wiring metal 14_21 to travel in a different direction and enters the effective pixel 111_1 adjacent to the effective pixel 111_2. The incident light ray 44b is reflected on the wiring metal 14_11 on the right in FIG. 6 and re-reflected on the wiring metal 14_21 to travel in a different direction and enters the effective pixel 111_3 adjacent to the effective pixel 111_2.

FIG. 7 illustrates a cross section of a portion of the isolated region 12 corresponding to the double-pointed arrow A3 in FIG. 3, for example. In the isolated region 12 illustrated in FIG. 7, the isolated pixel 121_1 is open upward, and the isolated shaded pixels 122 (122_1, 122_2) are covered with the shading metal 14_22 disposed above the pixel. In the isolated region 12, the wiring metals 14_11 and 14_21 are disposed above the pixel separation region 15. The shading metal 14_22 that covers the isolated shaded pixels 122 is positioned in the same layer as the wiring metals 14_21.

The configuration common to the isolated region 12 and the effective region 11 is that the metals are disposed in the lowest layer and in the middle layer. Thus, the incident light rays approaching the isolated pixel 121 illustrated in FIG. 7 behave in the same manner as those illustrated in FIG. 6. The incident light rays 41c, 41d, 42c, and 42d are not reflected by the wiring metals 14_11 and 14_21, and travel straight and directly enter the isolated pixel 121_1. The incident light rays 43c and 43d are reflected on the wiring metals 14_21 and thus are prevented from entering any isolated pixels 121. The incident light rays 44c and 44d are reflected on the wiring metals 14_11 and re-reflected on the wiring metals 14_21 to enter the isolated shaded pixels 122_1 and 122_2 that are located adjacent to the isolated pixel 121_1.

FIG. 8 illustrates a cross section of a portion of the shaded region 13 corresponding to, for example, the double-pointed arrow A4 in FIG. 3 and including an imaginary opening that is, as supposition, provided in this portion. The shaded region 13 illustrated in FIG. 8 includes an open pixel 131_1 open upward and the shaded pixels 132 (132_1, 132_2) covered with the shading metal 14_32 disposed above. The wiring metals 14_11 and 14_21 in the shaded region 13 are disposed above the pixel separation region 15. A shading metal 14_32 that covers the shaded pixels 132 and the pixel separation region 15 is disposed in the uppermost layer above the shaded pixels 132.

As discussed above, the isolated region 12 and the shaded region 13 differ from each other in that metals covering the pixels for shading are disposed at different height levels and cover a different area.

In the shaded region 13 illustrated in FIG. 8, the incident light rays 42 and 44 approaching the shaded region 13 behave in the same manner as the incident light rays 42 and 44 in FIGS. 6 and 7, but the incident light rays 41 and 43 behave in a different manner compared to the light rays in FIGS. 6 and 7. The incident light rays 42$e$ and 42$f$ are not reflected by the wiring metals 14_11 and 14_21, and travel straight and directly enter the open pixel 131_1. The incident light rays 41$e$ and 41$f$ are reflected on the uppermost shading metal 14_32 and thus are prevented from entering any one of the open pixel 131_1 and the shaded pixels 132_1 and 132_2.

The incident light rays 44$e$ and 44$f$ are reflected on the upper surface of the wiring metals 14_11 disposed in the lowest layer of the metals illustrated in FIG. 8, and then re-reflected on the lower surface of the wiring metals 14_21 to enter the shaded pixels 132_1 and 132_2 that are adjacent to the open pixel 131_1.

The incident light rays 43$e$ and 43$f$ are reflected on the upper surface of the wiring metals 14_21 disposed in the middle layer, and then re-reflected on the lower surface of the wiring metals 14_32 disposed in an upper layer to enter the shaded pixels 132_1 and 132_2 that are adjacent to the open pixel 131_1.

As illustrated in FIG. 8, the open pixel 131 is formed in the shaded region 13 to intentionally cause the light to leak from the open pixel 131 to the shaded pixels 132. The behavior of the incident light rays in the shaded region 13 significantly differs from the behavior in the effective region 11, and thus, the light leakage that occurs in the shaded region 13 largely differs from the light leakage that actually occurs in the effective region 11. In the present invention, the actual configuration of the shaded region 13 is such that no open pixel is provided as illustrated in FIG. 3.

The incident light rays approaching the isolated region 12 behave in the same manner as those approaching the effective region 11, and thus, the quantity of light leakage from an isolated pixel 121 to the isolated shaded pixels 122 is close to the quantity of light leakage that actually occurs in the effective region 11.

It should be noted that, in the isolated region 12, parasitic capacitance is generated between pixels by disposing the metal that covers the isolated shaded pixels 122 thereabove, and thus, a difference may arise between the quantity of light leakage measured in the isolated region 12 and the quantity of light leakage that actually occurs in the effective region 11. In the present embodiment, the shading metal 14_22 that covers the isolated shaded pixels 122 is disposed in the same layer as the uppermost wiring metals of the charge-to-voltage conversion circuits 123, that is, disposed in the same layer as the wiring metals 14_21 disposed in the middle layer. With this configuration, the parasitic capacitance is reduced to make the quantity of light leakage measured in the isolated region 12 closer to the quantity of light leakage that actually occurs in the effective region 11.

Method of Measuring Light Leakage

Figure 9:
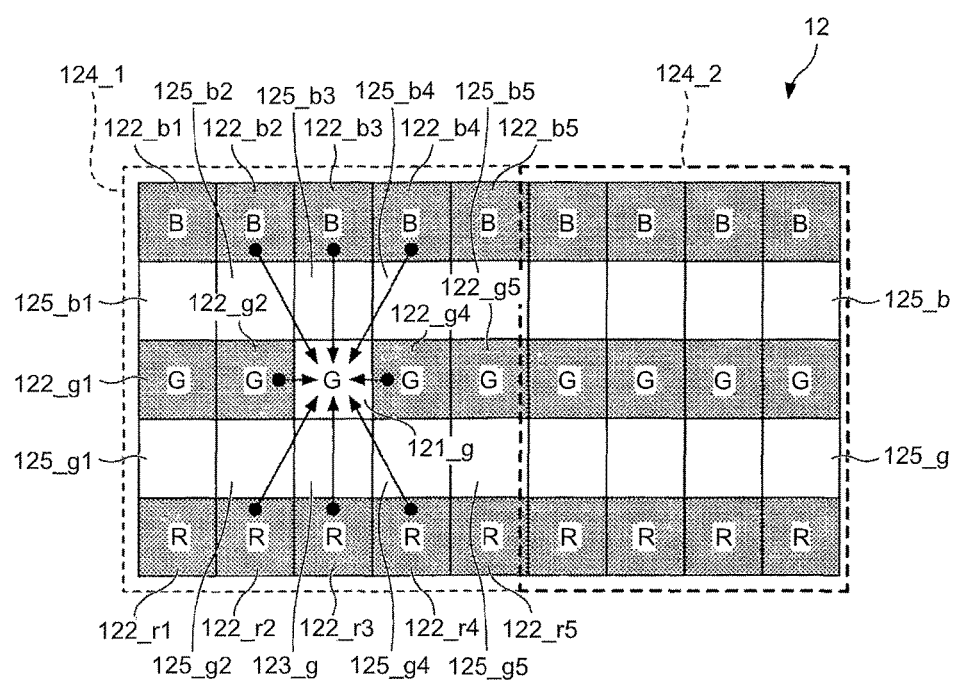
FIG. 9 is a diagram illustrating a method of measuring light leakage.

FIG. 9 is a diagram illustrating a method of measuring the quantity of light leakage. The following describes an example of measurement of the quantity of light leakage from an isolated pixel 121$g$ to isolated shaded pixels 122_, where  represents a combination of an alphabet and a number. The quantity of light leakage from the isolated pixel 121_$g$ to the isolated shaded pixels 122 can be obtained as a signal ratio calculated by the charge-to-voltage conversion circuits 123 and 125 based on values obtained from both pixels, for example. After the charge-to-voltage conversion circuits 123 and 125 convert light into charges, the quantity of light leakage is calculated by the image processor disposed at the subsequent stage of the horizontal signal processor 3 (see FIG. 1).

The second charge-to-voltage conversion circuits 125_$g$2 and 125_$g$4 respectively corresponding to the isolated shaded pixels 122_$g$2 and 122_$g$4 detect leaking charges on the basis of the values of the isolated shaded pixels 122_$g$2 and 122_$g$4. Thus, quantities of light leakage from the isolated pixel 121_$g$ to the adjacent pixels having the same color (green pixels in this case) can be obtained. The second charge-to-voltage conversion circuits 125_$g$1 and 125_$g$5 respectively corresponding to the isolated shaded pixels 122_$g$1 and 122_$g$5 detect leaking charges on the basis of the values of the isolated shaded pixels 122_$g$1 and 122_$g$5. Thus, quantities of light leakage from the isolated pixel 121_$g$ to the pixels next to the adjacent pixels having the same color (green pixels in this case) can be obtained.

From the values of the isolated shaded pixels 122_$b$1 to 122_$b$5 and 122_$r$1 to 122_$r$5, the quantity of color leakage can be obtained, that is, the quantity of light leakage from a certain pixel having a certain color (green pixel in this case) to pixels having a different color (blue or red pixels in this case) can be obtained.

In the isolated region 12 illustrated in FIG. 9, pixels are covered with the metal but the charge-to-voltage conversion circuits 123 and 125 are not. Thus, a value of each isolated shaded pixel 122 that is obtained as quantity of light leakage include not only quantity of light leakage from the isolated pixel 121_$g$ but also quantity of light leakage from the charge-to-voltage conversion circuits 125 to the isolated shaded pixels 122.

In the present embodiment, therefore, a first measurement region 124_1 including an isolated pixel 121 and isolated shaded pixels 122 disposed therearound and a second measurement region 124_2 including no isolated pixel 121 are provided adjacent to each other. In other words, the isolated region 12 includes the first measurement region 124_1 and the second measurement region 124_2, and the second measurement region 124_2 is configured to include only isolated shaded pixels 122.

The first measurement region 124_1 is provided for measuring the light leakage from the isolated pixel 121_$g$ to the isolated shaded pixels 122. The second measurement region 124_2 includes no isolated pixel 121, and thus, only an influence of the charge-to-voltage conversion circuits 125 can be found in the second measurement region 124_2. In other words, the second measurement region 124_2 is provided for measuring the light leakage from the charge-to-voltage conversion circuits 125 to the isolated shaded pixels 122. The average value of values obtained from the isolated shaded pixels 122 in the second measurement region 124_2 is subtracted from each value of the isolated shaded pixels 122 in the first measurement region 124_1, thereby obtaining a value of quantity of light leakage excluding light leakage from the charge-to-voltage conversion circuit 123 corresponding to the isolated pixel 121.

The second measurement region 124_2 is arranged two or more columns away from the isolated pixel 121 in the first measurement region 124_1 so that the second measurement region 124_2 will not be affected by the light leakage from the isolated pixel 121. The second measurement region 124_2 includes two or more columns of isolated shaded pixels 122 to obtain as accurate values as possible of light leakage (horizontally leaking charges) from the charge-to-voltage conversion circuits 125.

The charge-to-voltage conversion circuits in the entire pixel region 1 including the effective pixels 111 can be covered with the metal by using the circuit wirings, which can prevent light from entering the charge-to-voltage conversion circuits. This configuration can prevent light leakage from the charge-to-voltage conversion circuits to the pixels.

Method of Disposing Color Filters

Figure 10:
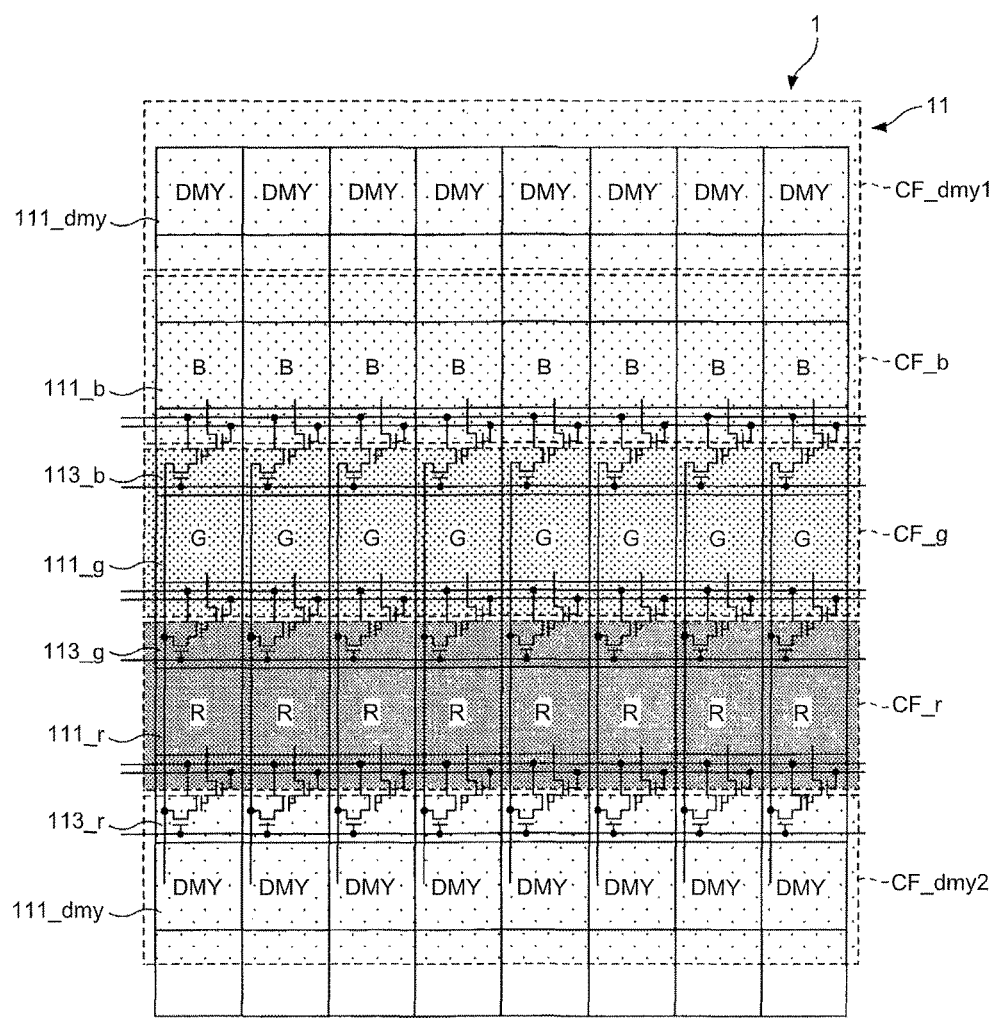
FIG. 10 is a diagram illustrating disposition of color filters.

FIG. 10 is a diagram illustrating disposition of color filters. Although FIG. 10 illustrates an example of the effective region 11 in the pixel region 1, the other regions have the same configuration as illustrated in FIG. 10.

The pixel region 1 is covered with a plurality of color filters each allowing light having a certain color (wavelength) to be transmitted. Each pixel receives light that has been transmitted through the corresponding color filter. The pixel region 1 illustrated in FIG. 10 includes a blue color filter CF_b, a green color filter CF_g, a red color filter CF_$_a$r, and color filters CF_dmy1 and CF_dmy2 for dummy pixels. These color filters are disposed in a certain order.

To reduce the amount of light entering the charge-to-voltage conversion circuits 113, the color filters CF also covers the charge-to-voltage conversion circuits 113. Disposing the adjacent color filters CF as close as possible can further reduce the amount of light entering the charge-to-voltage conversion circuits 113. Disposing the boundary between adjacent color filters CF in the middle portion between adjacent pixels can further reduce color leakage. In the example illustrated in FIG. 10, the boundary between the color filters CF is located on the charge-to-voltage conversion circuits 113.

Light Entering the Isolated Shaded Pixels

Figure 11:
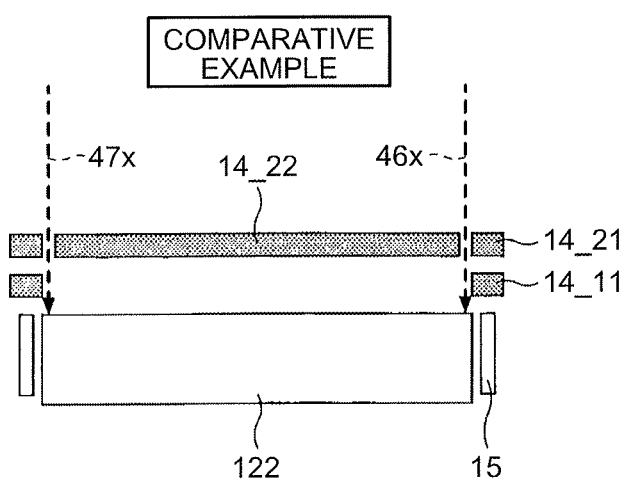
FIG. 11 is a schematic cross-sectional view illustrating light entering an isolated shaded pixel through gaps between wiring metals and a shading metal.
Figure 12:
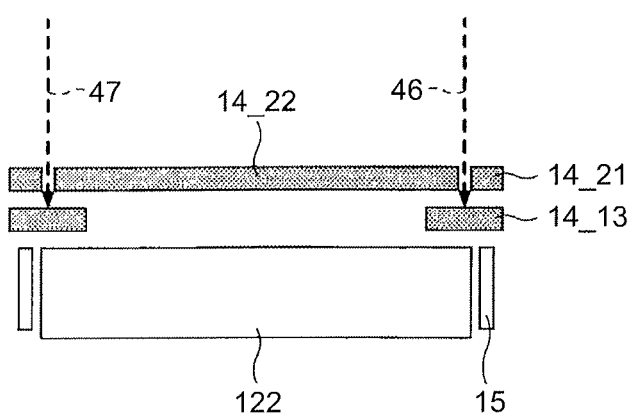
FIG. 12 is a schematic cross-sectional view illustrating a configuration for preventing light from entering the isolated shaded pixel through the gaps between the wiring metals and the shading metal.

FIG. 11 is a schematic cross-sectional view illustrating light entering an isolated shaded pixel through gaps between wiring metals and a shading metal. FIG. 12 is a schematic cross-sectional view illustrating a configuration for preventing light from entering the isolated shaded pixel through the gaps between the wiring metals and the shading metal.

The shading metal 14_22 that covers the isolated shaded pixel 122 is disposed in the middle layer (second layer). The wiring metals 14_21 are also disposed in the middle layer, and thus the wiring metals 14_21 and the shading metal 14_22 need a gap therebetween.

FIG. 11 is presented as a comparative example. FIG. 11 illustrates a case in which the wiring metals 14_11 having the same form as the wiring metals 14_21 are disposed immediately below the wiring metals 14_21. In this case, incident light rays 46x and 47x entering through the gaps between the wiring metals 14_21 and the shading metal 14_22 reach the isolated shaded pixel 122. The incident light rays 46x and 47x that enter the isolated shaded pixel 122 are not the light rays horizontally leaking from the isolated pixel 121 (see FIG. 7). However, there is a problem that light leakage measured from the isolated shaded pixel 122 contains an influence of the incident light rays 46x and 47x.

To prevent light from entering through the gaps, wiring metals 14_13 having a wider width extended to immediately below the gaps between the wiring metals 14_21 and the shading metal 14_22 are disposed in a lower layer than that of the shading metal 14_22 as illustrated in FIG. 12. To further prevent light from entering through the gaps, it is desirable that the wiring metals 14_13 have a much wider width extending to immediately below the shading metal 14_22 and overlap the shading metal 14_22. This configuration can prevent incident light rays 46 and 47 entering through the gaps from affecting a measured value of light leakage in the horizontal direction.

Processing System in Isolated Region

Figure 13:
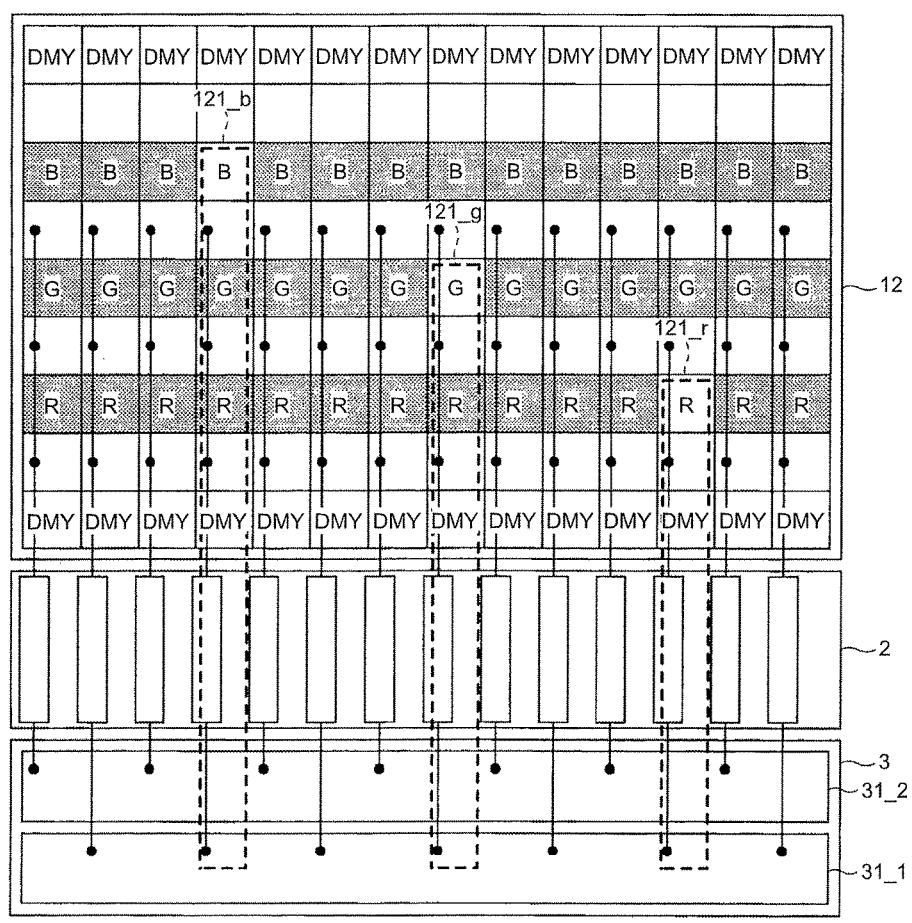
FIG. 13 is a diagram illustrating how signals are processed in the isolated region.

FIG. 13 is a diagram illustrating how signals are processed in the isolated region.

The horizontal signal processor 3 in an image sensor illustrated in FIG. 13 includes two horizontal signal processing circuits 31_1 and 31_2. In this image sensor, signals from the isolated pixels 121_b, 121_g, and 121_r are input to the same horizontal signal processing circuit 31_1 for processing. In other words, the horizontal signal processor 3 in the example of FIG. 13 includes a plurality of processing systems (horizontal signal processing circuits 31_1, 31_2, and so on).

Suppose that the signals output from the isolated pixels 121_b, 121_g, and 121_r are processed by different horizontal signal processing circuits. In this case, values obtained from the respective isolated pixels contain different components derived from characteristic differences between the horizontal signal processing circuits, which consequently affects the resulting values of light leakage.

When a horizontal signal processor includes a plurality of horizontal signal processing circuits, efforts are made to cause signals output from a plurality of isolated pixels to be processed by the same horizontal signal processing circuit so that characteristic differences between the horizontal signal processing circuits will not appear in the processing result.

FIG. 13 illustrates two processing circuits in the horizontal signal processor 3, for example. When three or more processing circuits are included, signals are processed in the same manner as described above. With regard to the vertical signal processor 2, signals are processed in the same manner as described above.

First Aspect

The imaging device according to a first aspect includes the pixel region 1 in which a plurality of pixels and a plurality of charge-to-voltage conversion circuits are arranged in matrix. The pixels include photoelectric conversion elements that output charges in accordance with the intensity of received light. The charge-to-voltage conversion circuits convert the charges output from the pixels into voltage signals. The pixel region includes the isolated region 12 including isolated shaded pixels 122 covered with the first shading metal 14_2 of the same layer as a layer of the wiring metals 14_21 of the charge-to-voltage conversion circuits 123, and an isolated pixel 121 not covered with the metal. In the isolated region, all the pixels surrounding the isolated pixel are the isolated shaded pixels.

Suppose that, as illustrated in FIG. 8, the shaded region in which the pixels and the charge-to-voltage conversion circuits are entirely covered with the metal for shading is formed with an open pixel by opening a part of the pixel portion, and that light leakage of light entering from above the open pixel is measured in the shaded region. The metal that optically shields the shaded region cannot be disposed in the same layer as the metal for the wirings of the charge-to-voltage conversion circuits, and thus, the metal for shading needs to be disposed in an upper layer than the metal for wiring. When the metal for shading is disposed at a level different from the level of the metal in the effective region for imaging a subject, light leaking from the open pixel to the adjacent pixels in the shaded region behaves significantly differently from that in the effective region. Thus, an accurate quantity of light leakage is difficult to acquire. In the shaded region, not only pixels but charge-to-voltage conversion circuits adjacent to the pixels are shaded, whereas, in the effective region, the charge-to-voltage conversion circuits are typically left unshaded. From this point of view, the quantity of light leakage obtained in the shaded region significantly differs from the quantity of light leakage in the effective region.

In the first aspect, the isolated region is provided as a region for measuring light leakage. In the isolated region, the metal that covers the isolated shaded pixels is positioned at the same level (the same height level relative to the pixels) as the metals (i.e., the wiring metals) disposed above the effective pixels that image a subject. According to the first aspect, a quantity of light leakage closer to the quantity of light leakage that actually occurs in the effective region for imaging a subject can be measured in the isolated region.

Second Aspect

In the imaging device according to a second aspect, the pixel region 1 includes the shaded region 13 in which the pixels (shaded pixels 132) and the charge-to-voltage conversion circuits 133 are entirely covered with the second shading metal 14_32 of an upper layer than the layer of the wiring metals 14_11 and 14_21.

The shaded pixels 132 in the shaded region 13 are pixels that no light enters. Thus, black-level data can be acquired from the shaded pixels 132, and dark correction can be performed by using data output from the imaging device.

Third Aspect

In the imaging device according to a third aspect, the pixel region 1 includes the effective region 11 including a plurality of effective pixels 111 that image a subject. The isolated region 12 is interposed between the effective region 11 and the shaded region 13.

Supposing that the shaded region is disposed adjacent to the effective region, pixels in a boundary region between the effective region and the shaded region are affected by each other, which consequently affects characteristics of the pixels in the boundary region in outputting charges.

In the third aspect, the effective region and the shaded region are arranged away from each other. Such arrangement can prevent pixels in the effective region and pixels in the shaded region from affecting each other.

Fourth Aspect

In the imaging device according to a fourth aspect, the first shading metal 14_22 is positioned in the same layer as the wiring metals 14_21 disposed in the uppermost layer out of the wiring metals.

It should be noted that, in the isolated region 12, parasitic capacitance is generated between pixels by disposing the metal that covers the isolated shaded pixels 122 thereabove, and thus, a difference may arise between the quantity of light leakage measured in the isolated region and the quantity of light leakage that actually occurs in the effective region 11. In the fourth aspect, the shading metal 14_22 that covers the isolated shaded pixels 122 is disposed in the same layer as the uppermost wiring metals of the charge-to-voltage conversion circuits 123, that is, disposed in the same layer as the wiring metals 14_21 disposed in the middle layer. With this configuration, the parasitic capacitance is reduced to make the quantity of light leakage measured in the isolated region 12 closer to the quantity of light leakage that actually occurs in the effective region 11.

Fifth Aspect

In the imaging device according to a fifth aspect, the pixel region 1 is covered with a plurality of color filters CF (CF_b, CF_g, and CF_r) each allowing a certain color of light to pass through, and the isolated region 12 includes at least one isolated pixel 121 (121_b, 121_g, and 121_r) for each color of the color filters.

The isolated region includes at least one isolated pixel for each color, and thus, the quantity of light leakage of each color can be measured.

Sixth Aspect

In the imaging device according to a sixth aspect, an isolated pixel 121_b that receives light having a color with the shortest wavelength out of a plurality of isolated pixels 121 (121_b, 121_g, and 121_r) is disposed closest to the effective region 11 including a plurality of effective pixels 111 that image a subject.

Light having a shorter wavelength causes less light leakage. For example, when the pixel region includes three colors of pixels that are red, green, and blue pixels, the isolated pixel 121_b that receives blue light having the shortest wavelength is disposed closer to the effective region 11. This configuration can minimize the influence of light leakage from the isolated pixel 121 on the effective region 111.

Seventh Aspect

In the imaging device according to a seventh aspect, two or more columns or two or more rows of the isolated shaded pixels 122 are interposed between an isolated pixel 121 and a next isolated pixel 121 located in the column direction or in the row direction.

If an isolated shaded pixel is disposed adjacent to two or more isolated pixels, the isolated shaded pixel detects light containing light leaking from the two or more isolated pixels. This configuration makes it difficult to accurately detect the light leakage from a single isolated pixel. According to the seventh aspect, two or more columns (or two or more rows) of isolated shaded pixels are disposed between an isolated pixel and a next isolated pixel. With this disposition, light leakage from the isolated pixels can be detected separately.

Eighth Aspect

In the imaging device according to an eighth aspect, the isolated region 12 includes two or more columns of isolated shaded pixels 122 that are not adjacent to any isolated pixel 121. In other words, the imaging device according to the eighth aspect includes the first measurement region 124_1 containing an isolated pixel 121 and isolated shaded pixels 122 that are adjacent to the isolated pixel 121, and the second measurement region 124_2 containing two or more columns of isolated shaded pixels 122 that are not adjacent to the isolated pixel 121.

In the first measurement region, data containing light leakage from the isolated pixel and light leakage from the charge-to-voltage conversion circuits can be acquired from the isolated shaded pixels. In the second measurement region, in which the isolated shaded pixels are not adjacent to any isolated pixel, data only affected by the light leakage from the charge-to-voltage conversion circuits can be obtained.

According to the eighth aspect, a value of light leakage from the charge-to-voltage conversion circuits can be obtained. Thus, light leakage from the isolated pixel can be accurately calculated by subtracting the value of light leakage leaking from the charge-to-voltage conversion circuits to the isolated shaded pixels in the first measurement region.

Ninth Aspect

The imaging device according to a ninth aspect includes a plurality of signal processing circuits (horizontal signal processing circuits 31_1, 31_2, and so on) that process signals output from the pixels via the corresponding charge-to-voltage conversion circuits. Signals from isolated pixels 121 are processed by the same signal processing circuit (horizontal signal processing circuit 31_1).

According to the ninth aspect, characteristic differences between signal processing circuits will not appear in the processing result.

Tenth Aspect

In a tenth aspect, an imaging system includes the imaging device according to any one of the first to ninth aspects and an image processor that processes signals output from the imaging device.

The imaging system according to the tenth aspect can have the same functions and effects as those in the first to ninth aspects.

According to the present invention, a quantity of light leakage close to the quantity of light leakage that actually occurs in a region for imaging a subject can be measured.

The above-described embodiments are illustrative and do not limit the present invention. Thus, numerous additional modifications and variations are possible in light of the above teachings. For example, at least one element of different illustrative and exemplary embodiments herein may be combined with each other or substituted for each other within the scope of this disclosure and appended claims. Further, features of components of the embodiments, such as the number, the position, and the shape are not limited the embodiments and thus may be preferably set. It is therefore to be understood that within the scope of the appended claims, the disclosure of the present invention may be practiced otherwise than as specifically described herein.

What is claimed is:

1. An imaging device comprising:
   a pixel region in which a plurality of pixels and a plurality of charge-to-voltage conversion circuits are arranged in matrix, the pixels including photoelectric conversion elements that output charges in accordance with intensity of received light, the charge-to-voltage conversion circuits converting the charges output from the pixels into voltage signals, wherein
   the pixel region includes an isolated region including
   isolated shaded pixels covered with a first shading metal of the same layer as a layer of wiring metals of the charge-to-voltage conversion circuits; and
   an isolated pixel that is not covered with the metal,
   all the pixels surrounding the isolated pixel in the isolated region are the isolated shaded pixels, and
   the pixel region includes a shaded region in which the pixels and the charge-to-voltage conversion circuits are entirely covered with a second shading metal of an upper layer than the layer of the wiring metals.

2. The imaging device according to claim 1, wherein
   the pixel region includes an effective region including a plurality of effective pixels that image a subject, and
   the isolated region is interposed between the effective region and the shaded region.

3. The imaging device according to claim 1, wherein the first shading metal is positioned in the same layer as a layer of uppermost wiring metals out of the wiring metals.

4. The imaging device according to claim 1, wherein
   the pixel region is covered with a plurality of color filters, each of the color filters allowing a certain color of light to pass through, and
   the isolated region includes at least one isolated pixel for each color of the color filters.

5. The imaging device according to claim 4, wherein an isolated pixel that receives light having a color with a shortest wavelength out of the isolated pixels is disposed closest to an effective region including a plurality of effective pixels that image a subject.

6. The imaging device according to claim 1, wherein two or more columns or two or more rows of the isolated shaded pixels are interposed between an isolated pixel and a next isolated pixel located in a column direction or in a row direction.

7. The imaging device according to claim 1, wherein the isolated region includes two or more columns of the isolated shaded pixels that are not adjacent to any isolated pixel.

8. The imaging device according to claim 1, further comprising:
   a plurality of signal processing circuits that process signals output from the pixels via the charge-to-voltage conversion circuits, wherein
   signals output from the isolated pixels are processed by a single signal processing circuit.

9. An imaging system comprising:
   the imaging device according to claim 1; and
   an image processor that processes signals output from the imaging device.

* * * * *